United States Patent [19]
Yu et al.

[11] Patent Number: 6,159,834
[45] Date of Patent: Dec. 12, 2000

[54] METHOD OF FORMING A GATE QUALITY OXIDE-COMPOUND SEMICONDUCTOR STRUCTURE

[75] Inventors: Zhiyi (Jimmy) Yu, Gilbert; Matthias Passlack, Chandler; Brian Bowers, Mesa; Corey Daniel Overgaard, Phoenix; Ravindranath Droopad; Jonathan Kwadwo Abrokwah, both of Tempe, all of Ariz.

[73] Assignee: Motorola, Inc., Schaumburg, Ill.

[21] Appl. No.: 09/022,595

[22] Filed: Feb. 12, 1998

[51] Int. Cl.$^7$ .................. H01L 21/3205; H01L 21/4763
[52] U.S. Cl. ..................... 438/590; 438/779; 438/763
[58] Field of Search .................. 438/779, 763, 438/38, 29, 72, 590, 782

[56] References Cited

U.S. PATENT DOCUMENTS

| | | | |
|---|---|---|---|
| 4,828,817 | 5/1989 | Outlaw | 423/579 |
| 5,124,762 | 6/1992 | Childs et al. | 357/16 |
| 5,451,548 | 9/1995 | Hunt et al. | 437/225 |
| 5,550,089 | 8/1996 | Dutta et al. | 437/225 |
| 5,597,768 | 1/1997 | Passlack et al. | 437/236 |
| 5,665,658 | 9/1997 | Passlack | 438/763 |
| 5,904,553 | 5/1999 | Passlack et al. | 438/590 |

OTHER PUBLICATIONS

An article entitled "Thermodynamic and photochemical stability of low interface state density $Ga_2O_3$–GaAs structures fabricated by in situ molecular beam epitaxy" from Appl. Phys. Lett. 69(3), M. Passlack et al., pp. 302–304 (Jul. 15, 1996).

An article entitled "Recombination velocity at oxide–GaAs interfaces fabricated by in situ molecular beam epitaxy" from Appl. Phys. Lett. 68(25), M. Passlack et al., pp. 3605–3607 (Jun. 17, 1996).

An article entitled "Quasistatic and high freqeuncy capacitance–voltage characterization of $Ga_2O_3$–GaAs structures fabricated by in situ molecular beam epitaxy" from Appl. Phys. Lett. vol. 68, No. 8, M. Passlack et al., pp. 1099–1101 (Feb. 19, 1996).

An article entitled "Anisotropy of electrical and optical properties in B–$Ga_2O_3$ single crystals" from Appl. Phys. Lett. 71(7), N. Ueda et al., pp. 933–935 (Aug. 18, 1997).

An article entitled "Synthesis and control of conductivity of ultraviolet transmitting B–$Ga_2O_3$ single crystals" from Appl. Phys. Lett. 70(26), N. Ueda, pp. 3561–3563 (Jun. 30, 1997).

Advances in Coatings Technologies for Corrosion and Wear resistant Coatings, Proceedings of a Symposium held in at the Annual Meeting of the Minerals, Metals,& Materials Society, 1195, edited by A.R. Srivasta, Warrendale, The Society, c 1995, p. 100.

The technology and Physics of Molecular Beam Epitaxy, edited by E.H.C. Parker, Plenum Press New York, 1985, p. 630

"Materials Fundamentals of Molecular Beam Epitaxy," Jeffrey Y. Tsao, Academic Press, Boston 1992, p. xi.

*Primary Examiner*—Charles Bowers
*Assistant Examiner*—Hsien-Ming Lee
*Attorney, Agent, or Firm*—A. Kate Huffman; Gregory J. Gorrie

[57] ABSTRACT

A gate quality oxide-compound semiconductor structure (10) is formed by the steps of providing a III-V compound semiconductor wafer structure (13) with an atomically ordered and chemically clean semiconductor surface in an ultra high vacuum (UHV) system (20), directing a molecular beam (26) of gallium oxide onto the surface of the wafer structure to initiate the oxide deposition, and providing a second beam (28) of atomic oxygen to form a $Ga_2O_3$ layer (14) with low defect density on the surface of the wafer structure. The second beam of atomic oxygen is supplied upon completion of the first 1–2 monolayers of $Ga_2O_3$. The molecular beam of gallium oxide is provided by thermal evaporation from a crystalline $Ga_2O_3$ or gallate source, and the atomic beam of oxygen is provided by either RF or microwave plasma discharge, thermal dissociation, or a neutral electron stimulated desorption atom source.

27 Claims, 2 Drawing Sheets

METHOD OF FORMING A GATE QUALITY OXIDE-COMPOUND SEMICONDUCTOR STRUCTURE

FIELD OF THE INVENTION

The present invention pertains to fabrication methods of gate quality oxide-compound semiconductor structures and more specifically to fabrication methods of gate quality oxide-compound semiconductor structures for use in semiconductor devices and integrated circuits.

BACKGROUND OF THE INVENTION

Metal-oxide-semiconductor (MOS) technologies have many advantages and such technologies are widely used in the silicon semiconductor industry. The requirements for gate quality oxide-semiconductor structures are manifold: (i) low interface state density $D_{it} < 10^{11}$ cm$^{-2}$ eV$^{-1}$, (ii) low trap density $N_t \leq$ low $10^{11}$ cm$^{-2}$ in the oxide film, (iii) thermodynamic interface and oxide stability, and (iv) interface and oxide reliability in particular related to oxide damage caused by injection of (hot) carriers.

For compound semiconductors, prior art, for instance M. Passlack et al., Appl. Phys. Lett., vol. 68, 1099 (1996), Appl. Phys. Lett., vol. 68, 3605 (1996), and Appl. Phys. Lett., vol. 69, 302 (1996) reported the fabrication of oxide-III-V compound semiconductor structures using in situ deposition of gallium oxide molecules on GaAs based epitaxial layers while maintaining an ultra-high vacuum (UHV). The thus fabricated $Ga_2O_3$-GaAs interfaces have an interface state density $D_{it}$ of $2.5 \times 10^{10}$ cm$^{-2}$ eV$^{-1}$ and the GaAs band gap is fully accessible. However, the properties of oxides fabricated in prior art are inadequate for applications mainly because of the presence of defects related to oxygen vacancies; the breakdown field $E_{BD}$ and the specific resistivity $\rho$ are typically less than 3 MV/cm and lower than $10^{13}$ $\Omega$cm, respectively, and trap densities as high as $2 \times 10^{12}$ cm$^{-2}$ have been found. This gives rise to stability and reliability problems including charge trapping, carrier injection, long term drift of device parameters in accumulation and inversion, and eventually, oxide degradation and breakdown. Consequently, the performance of unipolar and bipolar devices is affected and the fabrication of stable and reliable metal-oxide-semiconductor field effect transistors (MOSFET) based on compound semiconductors has been impossible.

Accordingly, it would be highly desirable to provide new methods of manufacturing which overcome these problems. Thus what is needed is a new and improved method of manufacturing a gate quality oxide-compound semiconductor structure. What is also needed is a new and improved method of manufacturing a gate quality $Ga_2O_3$-compound semiconductor structure. What is also needed is a new and improved method of manufacturing a gate quality $Ga_2O_3$-compound semiconductor structure wherein the density of defects related to oxygen vacancies is adequate for MOSFET applications. What is also needed is a new and improved method of manufacturing a gate quality $Ga_2O_3$-compound semiconductor structure wherein the oxide specific resistivity is adequate for MOSFET applications.

What is also needed is a new and improved method of manufacturing a gate quality $Ga_2O_3$-compound semiconductor structure wherein the oxide breakdown field is adequate for MOSFET applications. What is also needed is a new and improved method of manufacturing a gate quality $Ga_2O_3$-compound semiconductor structure with oxide trap density $\leq 10^{11}$ cm$^{-2}$. What is also needed is a new and improved method of manufacturing a gate quality $Ga_2O_3$-compound semiconductor structure with oxide trap density $\leq 10^{11}$ cm$^{-2}$ and interface state density $\leq 10^{11}$ eV$^{-1}$ cm$^{-2}$. What is also needed is a new and improved method of manufacturing a gate quality oxide-compound semiconductor structure with improved stability and reliability. What is also needed is a new and improved method of manufacturing a gate quality oxide-compound semiconductor structure which allows the implementation of stable, reliable, and manufacturable accumulation and/or inversion mode devices using compound semiconductors. What is also needed is a new and improved method of manufacturing a gate quality $Ga_2O_3$-compound semiconductor structure which is relatively easy to fabricate and use.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

Figure 1:
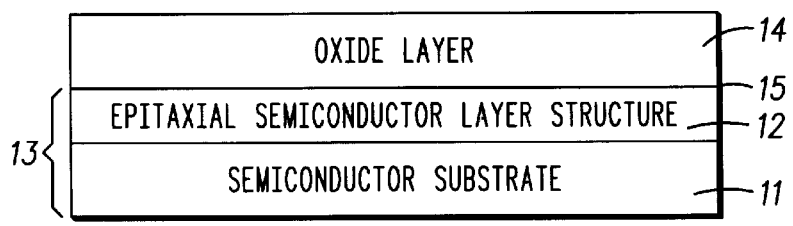
FIG. 1 is a simplified cross-sectional view of a gate quality oxide-compound semiconductor structure in accordance with a preferred embodiment of the present invention.

The exemplification set out herein illustrates a preferred embodiment of the invention in one form thereof, and such exemplification is not intended to be construed as limiting in any manner.

DETAILED DESCRIPTION OF THE DRAWINGS

The present invention provides, among other things, a new and improved method of manufacturing a gate quality oxide-compound semiconductor structure. The present invention also provides a new and improved method of manufacturing a gate quality $Ga_2O_3$-compound semiconductor structure. The present invention also provides a new and improved method of manufacturing a gate quality $Ga_2O_3$-compound semiconductor structure wherein the density of defects related to oxygen vacancies is adequate for MOSFET applications. The present invention also provides a new and improved method of manufacturing a gate quality $Ga_2O_3$-compound semiconductor structure wherein the oxide specific resistivity is adequate for MOSFET applications.

The present invention also provides a new and improved method of manufacturing a gate quality $Ga_2O_3$-compound semiconductor structure wherein the oxide breakdown field is adequate for MOSFET applications. The present invention also provides a new and improved method of manufacturing a gate quality $Ga_2O_3$-compound semiconductor structure with an oxide trap density $\leq 10^{11}$ cm$^{-2}$. The present invention also provides a new and improved method of manufacturing a gate quality $Ga_2O_3$-compound semiconductor structure with an oxide trap density $\leq 10^{11}$ cm$^{-2}$ and interface state density $\leq 10^{11}$ eV$^{-1}$ cm$^{-2}$. The present invention also provides a new and improved method of manufacturing a gate quality oxide-compound semiconductor structure with improved stability and reliability. The present invention also provides a new and improved method of manufacturing a gate quality oxide-compound semiconductor structure which allows the implementation of stable, reliable, and manufacturable accumulation and/or inversion mode devices using compound semiconductors. The present invention also provides a new and improved method of manufacturing a gate quality $Ga_2O_3$-compound semiconductor structure which is relatively easy to fabricate and use.

The above problems and others are at least partially solved and the above purposes and others are realized in a method of fabricating a gate quality oxide-compound semiconductor structure including the steps of providing a compound semiconductor wafer structure with an atomically ordered and chemically clean semiconductor surface. The steps further include directing a molecular beam of gallium oxide onto the surface of the wafer structure to initiate the oxide deposition, and providing a second beam of atomic oxygen to form a $Ga_2O_3$ layer with low defect density on the surface of the wafer structure.

In a preferred embodiment, a III-V compound semiconductor wafer structure with an atomically ordered and chemically clean semiconductor surface is provided in an ultra high vacuum (UHV) system. A molecular beam of gallium oxide is directed onto the surface of the wafer structure to initiate the oxide deposition, and a second beam of atomic oxygen is supplied upon completion of the first 1–2 monolayers of $Ga_2O_3$. The molecular beam of gallium oxide is provided by thermal evaporation from a crystalline $Ga_2O_3$ or gallate source, and the atomic beam of oxygen is provided by any one of RF or microwave plasma discharge, thermal dissociation, or a neutral electron stimulated desorption atom source.

FIG. 1 is a simplified cross-sectional view of a gate quality oxide-compound semiconductor structure in accordance with a preferred embodiment of the present invention. Structure 10 includes a compound semiconductor material, such as any III-V material employed in a semiconductor device, represented herein by a III-V semiconductor substrate 11 and a compound semiconductor epitaxial layer structure 12. For purposes of this disclosure, the substrate and epitaxial layers formed thereon will be referred to simply as a compound semiconductor wafer structure 13. Compound semiconductor wafer structure 13 has an atomically ordered and chemically clean upper surface 15 onto which an oxide layer 14 is positioned using a molecular beam of gallium oxide to initiate the oxide deposition, and providing a second beam of atomic oxygen such that a gate quality oxide-compound semiconductor structure is formed. It will of course be understood that in some specific applications (or on some portions of compound semiconductor wafer structure 13) there may be no epitaxial layers present and upper surface 15 may simply be the upper surface of the substrate 11.

Figure 2:
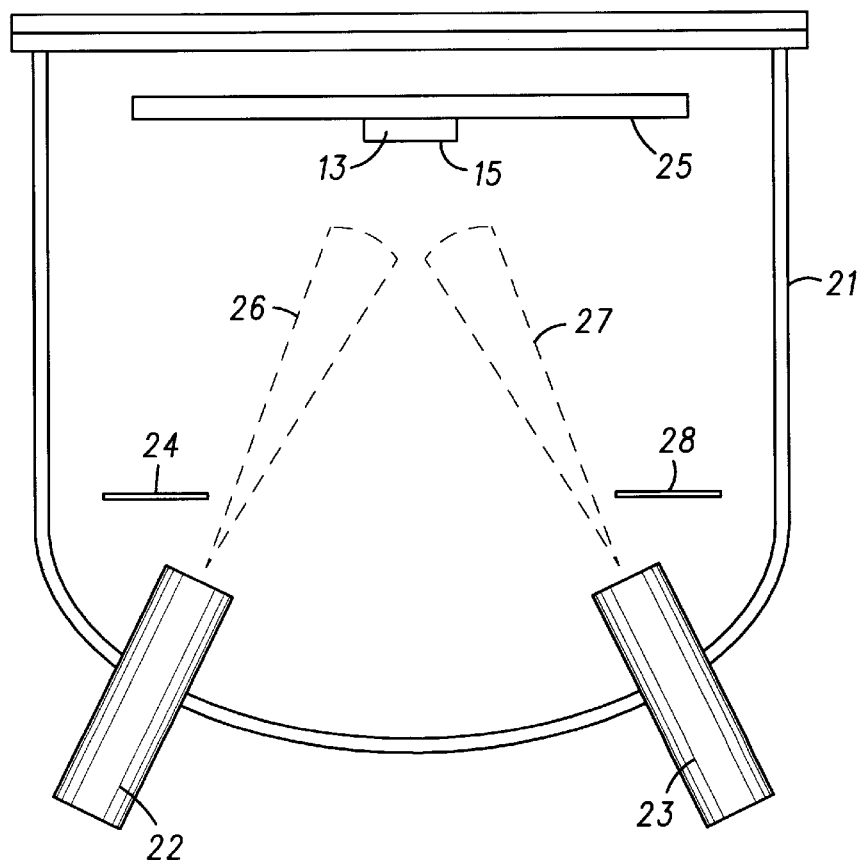
FIG. 2 illustrates an ultra high vacuum (UHV) molecular beam epitaxy system utilized in fabricating the structure of FIG. 1 in accordance with a preferred embodiment of the present invention.

FIG. 2 illustrates an ultra high vacuum (UHV) molecular beam epitaxy (MBE) system utilized in fabricating the structure of FIG. 1 in accordance with a preferred embodiment of the present invention. System 20 includes a UHV chamber 21, a high temperature effusion cell 22, a source 23 for atomic oxygen, cell shutters 24 and 28, and a substrate holder 25 such as a platen. It will of course be understood that system 20 may allow the manufacture of a multiplicity of wafers simultaneously and/or includes other standard sources which are routinely used in MBE but which are not shown in FIG. 2, for instance effusion cells for Ga, As, Al, In, Ge etc.

In a specific embodiment, a III-V compound semiconductor wafer structure 13 with an atomically ordered and chemically clean upper surface 15 is mounted onto substrate holder 25 and loaded into UHV chamber 21. The upper surface 15 of semiconductor wafer structure 13 may be provided by epitaxial layer structure 12. Subsequently, compound semiconductor wafer structure 13 is heated to the substrate deposition temperature. A crystalline $Ga_2O_3$ or gallate source is thermally evaporated using a high temperature effusion cell 22 wherein the vaporization of $Ga_2O_3$ which is connected with thermal dissociation may be represented as:

$$Ga_2O_{3(s)} \rightarrow Ga_2O_{(g)} + O_{2(g)} \qquad (1)$$

The deposition of $Ga_2O_3$ molecules on the atomically ordered and chemically clean upper surface 15 of compound semiconductor wafer structure 13 is initiated by opening the cell shutter 24 and providing a molecular beam of gallium oxide 26 directed onto upper surface 15 wherein the energetically favored reaction ($\Delta G = -139$ kcal/mol at a typical substrate temperature of 700 K) may be represented as:

$$Ga_2O_{(s)} + O_{2(g)} \rightarrow Ga_2O_{3(s)} \qquad (2)$$

and occurs on upper surface 15 of compound semiconductor wafer structure 13. From a kinetics point of view, the rate limiting step in the reaction (equation 2) is the dissociative chemisorption rate of $O_2$ on $Ga_2O$. In turn, a slow rate of reaction (equation 2) gives rise to oxygen vacancies in the oxide film (oxide layer 14) by the following reaction ($\Delta G = 0.3$ kcal/mol at 700 K) which may be represented as:

$$3Ga_2O_{(s)} \rightarrow Ga_2O_{3(s)} + 4Ga_{(s)} \qquad (3)$$

Typically, the thus created defects related to oxygen vacancies in oxide layer 14 severely affect the properties such as breakdown field, specific resistivity, and trap density of oxide layer 14.

Thus, in order to fabricate gate quality oxide-compound semiconductor structures in accordance with the preferred embodiments of the present invention, a second beam of atomic oxygen 27 is directed onto upper surface 15 of wafer structure 13 by opening the shutter 28 of the atomic oxygen source 23. The shutter may be opened at any time during the initial oxide deposition, preferentially after 1–2 monolayers of $Ga_2O_3$ have been deposited since surface oxidation of GaAs needs to be completely eliminated for low interface state density of the $Ga_2O_3$-GaAs interface. The use of atomic oxygen eliminates the need for thermal dissociation of $O_2$ which substantially increases the rate of reaction (2) and in turn, reduces the density of oxygen vacancies in the oxide film (oxide layer 14) to levels which are adequate for MOS applications.

Figure 3:
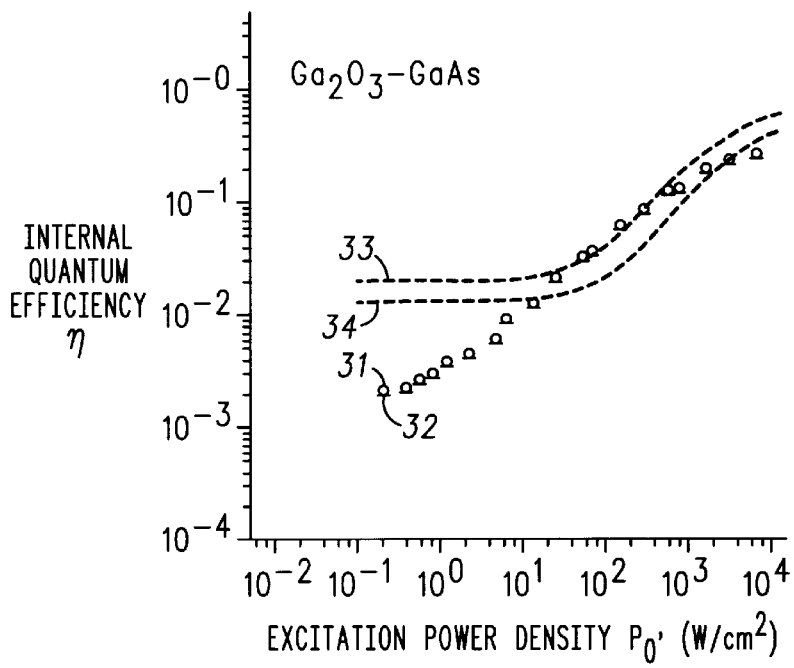
FIG. 3 is a graph illustrating the measured and simulated internal quantum efficiency η of a gate quality oxide-compound semiconductor wafer in accordance with a preferred embodiment of the present invention.

FIG. 3 is a graph illustrating the measured 31 and 32 (symbols) and simulated 33 and 34 (dashed lines) internal quantum efficiency η of an oxide-compound semiconductor wafer structure 10 are shown. A numerical simulator for semiconductor heterostructures has been used and the simulated results have been fitted to the measurements. Curve 31 (triangles) depicts the measured internal quantum efficiency η for a gate quality oxide-compound semiconductor wafer structure 10 fabricated according to the invention wherein the shutter 28 of atomic oxygen source 23 was opened after deposition of one monolayer of $Ga_2O_3$. Also, curve 32 (circles) shows the measured efficiency η of a prior art oxide-compound semiconductor wafer structure fabricated without using atomic oxygen for the purpose of comparison, and curve 33 and curve 34 depict the calculated results using an interface recombination velocity S of 32,000 and 50,000 cm/s, respectively. The aforementioned S correspond to an interface state density of $\equiv 2 \times 10^{11}$ cm$^{-2}$.

The quantum efficiency of the gate quality oxide-compound semiconductor wafer structure 10 fabricated according to the invention (curve 31) is virtually identical to that of a prior art oxide-compound semiconductor wafer structure fabricated without using atomic oxygen (curve 32) which clearly demonstrates that GaAs surface oxidation and subsequent $Ga_2O_3$-GaAs interface degradation can be completely avoided if the shutter 28 of the atomic oxygen source 23 is opened after one monolayer of $Ga_2O_3$ has been deposited.

Figure 4:
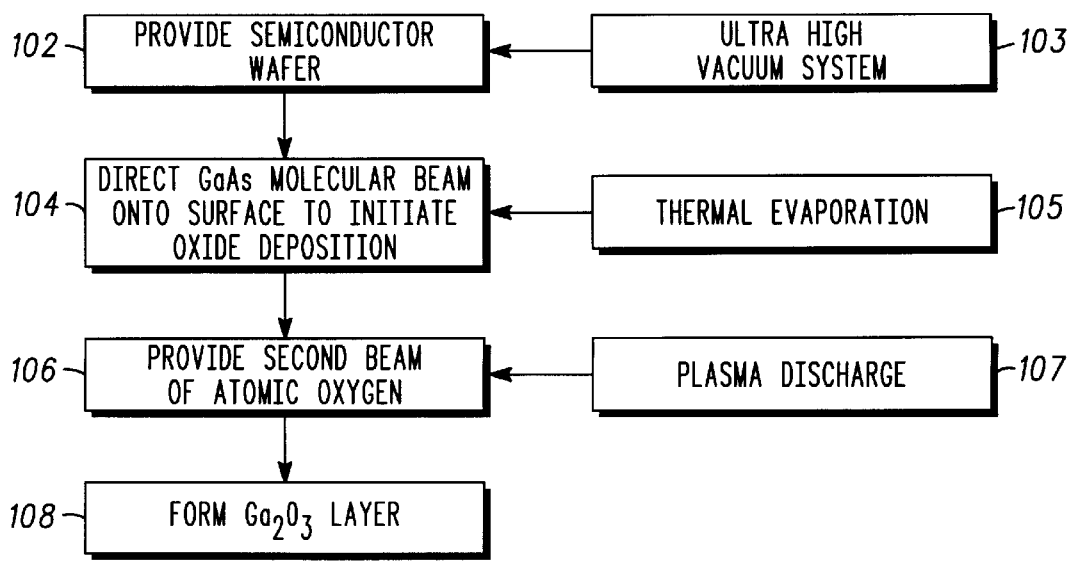
FIG. 4 is a flow chart illustrating a method of fabricating a gate quality oxide-compound semiconductor structure in accordance with a preferred embodiment of the present invention.

FIG. 4 is a flow chart illustrating a method of fabricating a gate quality oxide-compound semiconductor structure in accordance with a preferred embodiment of the present invention. In step 102, a compound semiconductor wafer structure with an atomically ordered and chemically clean semiconductor surface is provided. In step 104, a molecular beam of gallium oxide is directed onto the surface of the wafer structure to initiate the oxide deposition. In step 106, a second beam of atomic oxygen is provided to form a $Ga_2O_3$ layer with low defect density on the surface of the wafer structure.

In a preferred embodiment, a III-V compound semiconductor wafer structure with an atomically ordered and chemically clean semiconductor surface is provided in step 102 in an ultra high vacuum (UHV) system 103. In step 104, a molecular beam of gallium oxide is directed onto the surface of the wafer structure to initiate the oxide deposition. In step 106, the second beam of atomic oxygen is supplied upon completion of the first 1–2 monolayers of $Ga_2O_3$. The molecular beam of gallium oxide is desirably provided by thermal evaporation 105 from a crystalline $Ga_2O_3$ or gallate source. The atomic beam of oxygen is desirably provided by RF or microwave plasma discharge 107, thermal dissociation, or a neutral electron stimulated desorption atom source. The gate quality oxide-compound semiconductor structure 108 is formed upon the completion of steps 104 and 106.

Thus, a new and improved method of manufacturing a gate quality oxide-compound semiconductor structure is disclosed. The new and improved fabrication method of gate quality $Ga_2O_3$-compound semiconductor structures reduces the density of oxygen related oxide defects to a level which is adequate for MOS applications and provides a low oxide trap density $\leq 10^{11}$ cm$^{-2}$ and a low interface state density $\leq 10^{11}$ eV$^{-1}$ cm$^{-2}$. These improvements essentially solve or overcome the problems of prior art such as inadequate breakdown field and specific resistivity as well as dc instability and poor reliability and enable the implementation of stable, reliable, and manufacturable accumulation and/or inversion mode devices using compound semiconductors.

The present invention has been described in conjunction with the illustrative embodiment of the invention. As will be apparent to those skilled in the art, various changes and modifications may be made to the above-described embodiment without departing from the spirit or scope of the invention. It is intended that the invention be limited not by the illustrative embodiment, but be limited only by the scope of the claims appended hereto.

What is claimed is:

1. A method of manufacturing a gate quality oxide-compound semiconductor structure comprising:
   providing a compound semiconductor wafer structure with an atomically ordered and chemically clean upper surface; and
   forming an insulating oxide layer on the upper surface of the wafer structure by depositing insulating oxide material onto the wafer structure using a molecular beam epitaxy system having two beams, a first beam being a molecular beam of gallium oxide and a second beam being an atomic beam of oxygen.

2. A method of manufacturing a gate quality oxide-compound semiconductor structure as claimed in claim 1 wherein the step of forming an insulating oxide layer includes the step of depositing a $Ga_2O_3$ layer on the upper surface of a compound semiconductor wafer structure.

3. A method of manufacturing a gate quality oxide-compound semiconductor structure as claimed in claim 1 wherein the step of forming an insulating oxide layer includes the step of providing a molecular beam of gallium oxide using thermal evaporation of a crystalline gallate or $Ga_2O_3$.

4. A method of manufacturing a gate quality oxide-compound semiconductor structure as claimed in claim 1 wherein the step of forming an insulating oxide layer includes the step of providing an atomic beam of oxygen using RF plasma discharge.

5. A method of manufacturing a gate quality oxide-compound semiconductor structure as claimed in claim 1 wherein the step of forming an insulating oxide layer includes the step of providing an atomic beam of oxygen using microwave plasma discharge.

6. A method of manufacturing a gate quality oxide-compound semiconductor structure as claimed in claim 1 wherein the step of forming an insulating oxide layer includes the step of providing an atomic beam of oxygen using thermal dissociation.

7. A method of manufacturing a gate quality oxide-compound semiconductor structure as claimed in claim 1 wherein the step of forming an insulating oxide layer includes the step of providing an atomic beam of oxygen using a neutral electron stimulated desorption atom source.

8. A method of manufacturing a gate quality oxide-compound semiconductor structure as claimed in claim 1 wherein the step of forming an insulating oxide layer includes directing a molecular beam of gallium oxide and an atomic beam of oxygen onto the upper surface of a compound semiconductor wafer structure simultaneously.

9. A method of manufacturing a gate quality oxide-compound semiconductor structure as claimed in claim 1 wherein the step of forming an insulating oxide layer includes directing a molecular beam of gallium oxide onto the upper surface of a compound semiconductor wafer structure to initiate the oxide deposition, and directing a second beam of atomic oxygen onto the upper surface of a compound semiconductor wafer structure by opening a shutter of an atomic oxygen source at a time during oxide deposition.

10. A method of manufacturing a gate quality oxide-compound semiconductor structure as claimed in claim 1 wherein the step of forming an insulating oxide layer includes directing a molecular beam of gallium oxide onto the upper surface of a compound semiconductor wafer structure to initiate oxide deposition, and directing a second beam of atomic oxygen onto the upper surface of a compound semiconductor wafer structure by opening a shutter of an atomic oxygen source after 1–2 monolayers of $Ga_2O_3$ have been deposited.

11. A method of manufacturing a gate quality oxide-compound semiconductor structure as claimed in claim 1 wherein the step of forming an insulating oxide layer includes the step of depositing of a $Ga_2O_3$ layer wherein density of oxygen vacancies in the $Ga_2O_3$ layer is reduced.

12. A method of manufacturing a gate quality oxide-compound semiconductor structure as claimed in claim 1 wherein the step of forming an insulating oxide layer includes the step of depositing of a $Ga_2O_3$ layer wherein a trap density in the $Ga_2O_3$ layer is reduced.

13. A method of manufacturing a gate quality oxide-compound semiconductor structure as claimed in claim 1 wherein the step of forming an insulating oxide layer includes the step of depositing of a $Ga_2O_3$ layer on the upper surface of a compound semiconductor wafer structure which provides a low oxide trap density $\leq 10^{11}$ $cm^{-2}$ and a low interface state density $\leq 10^{11}$ $eV^{-1}$ $cm^{-2}$.

14. A method of manufacturing a gate quality oxide-compound semiconductor structure as claimed in claim 1 wherein the step of providing a compound semiconductor wafer structure with an atomically ordered and chemically clean upper surface includes the step of epitaxially growing compound semiconductor layers on the upper surface of a compound semiconductor substrate.

15. A method of manufacturing a gate quality oxide-compound semiconductor structure as claimed in claim 14 wherein the step of epitaxially growing compound semiconductor layers includes epitaxially growing GaAs on the upper surface of the semiconductor wafer structure.

16. A method of manufacturing a gate quality oxide-compound semiconductor structure as claimed in claim 14 wherein the step of epitaxially growing compound semiconductor layers includes epitaxially growing $Al_xGa_{1-x}As$, $In_yGa_{1-y}As$, or $In_zGa_{1-z}P$ layers on the upper surface of a compound semiconductor substrate.

17. A method of manufacturing a gate quality oxide-compound semiconductor structure as claimed in claim 14 wherein the step of providing a compound semiconductor substrate includes the step of providing a GaAs based semiconductor wafer.

18. A method of manufacturing a gate quality oxide-compound semiconductor structure as claimed in claim 1 wherein the step of providing a compound semiconductor wafer structure includes providing a semiconductor wafer structure with a semiconductor device formed thereon.

19. A gate quality oxide-compound semiconductor structure comprising:

an atomically ordered and chemically clean upper surface; and an insulating oxide layer deposited on the upper surface of the wafer structure using a molecular beam epitaxy system having two beams, a first beam being a molecular beam of gallium oxide and a second bean being an atomic beam of oxygen.

20. A gate quality oxide-compound semiconductor structure as claimed in claim 19 wherein the insulating oxide layer includes $Ga_2O_3$.

21. A gate quality oxide-compound semiconductor structure as claimed in claim 19 wherein the insulating oxide layer has an oxide trap density $\leq 10^{11}$ $cm^{-2}$ and an interface state density $\leq 10^{11}$ $eV^{-1}$ $cm^{-2}$.

22. A gate quality oxide-compound semiconductor structure as claimed in claim 19 wherein the upper surface of the compound semiconductor wafer structure includes GaAs.

23. A gate quality oxide-compound semiconductor structure as claimed in claim 19 wherein the compound semiconductor wafer structure includes epitaxially grown layers of compound semiconductor material on the upper surface of a compound semiconductor substrate.

24. A gate quality oxide-compound semiconductor structure as claimed in claim 19 wherein the compound semiconductor wafer structure includes epitaxially grown $Al_xGa_{1-x}As$, $In_yGa_{1-y}As$, or $In_zGa_{1-z}P$ layers on the upper surface of a compound semiconductor substrate.

25. A gate quality oxide-compound semiconductor structure as claimed in claim 24 wherein the compound semiconductor substrate includes GaAs.

26. A method of manufacturing a gate quality oxide-compound semiconductor structure comprising:

providing a GaAs III-V compound semiconductor wafer structure with an atomically ordered and chemically clean semiconductor surface in an ultra high vacuum (UHV) system;

utilizing a molecular beam epitaxy system having two beams to direct a molecular beam of gallium oxide onto the atomically ordered and chemically clean semiconductor surface of the compound semiconductor wafer structure to initiate oxide deposition and to provide a beam of atomic oxygen to form a $Ga_2O_3$ layer with low defect density on the atomically ordered and chemically clean semiconductor surface of the compound semiconductor wafer structure, said beam of atomic oxygen being supplied upon completion of first 1–2 monolayers of $Ga_2O_3$.

27. A method as claimed in claim 26 wherein said molecular beam of gallium oxide is provided by thermal evaporation from either a crystalline $Ga_2O_3$ or gallate source, and wherein the beam of atomic oxygen is provided by plasma discharge.

* * * * *